United States Patent [19]

Duffy et al.

[11] 3,770,516

[45] Nov. 6, 1973

[54] MONOLITHIC INTEGRATED CIRCUITS

[75] Inventors: Michael C. Duffy, Poughkeepsie; Paul A. Schumann, Jr., Wappingers Falls; Tsu-Hsing Yeh, Poughkeepsie, all of N.Y.

[73] Assignee: International Business Machines Corporation, Armonk, N.Y.

[22] Filed: Jan. 12, 1972

[21] Appl. No.: 217,407

Related U.S. Application Data

[62] Division of Ser. No. 750,650, Aug. 6, 1968, Pat. No. 3,655,457.

[52] U.S. Cl. .................................. 148/33, 317/235

[51] Int. Cl. .............................................. H01l 7/54

[58] Field of Search .............................. 148/1.5, 33; 317/235 AQ, 235, 48.9

[56] References Cited

UNITED STATES PATENTS

| | | | |
|---|---|---|---|
| 3,272,661 | 9/1966 | Tomono et al. | 148/1.5 |
| 3,388,009 | 6/1968 | King | 148/1.5 |
| 3,445,926 | 5/1969 | Medved et al. | 148/1.5 X |
| 3,660,171 | 5/1972 | Tsuchimoto et al. | 148/1.5 |
| 3,707,765 | 1/1973 | Coleman | 148/1.5 |

OTHER PUBLICATIONS

"Implantation and Annealing Behavior of Group III and V Dopants in Silicon Etc." Eriksson et al., J. App. Phys. Vol. 40, No. 2, Feb. 69, pp. 842–854.

*Primary Examiner*—L. Dewayne Rutledge
*Assistant Examiner*—J. M. Davis
*Attorney*—Maurice H. Klitzman

[57] ABSTRACT

Monolithic integrated circuits are made utilizing various ion implantation techniques for making diodes, transistors, resistors, capacitors, underpass connections, sub-collector junctions, etc., and for altering impurity profiles, gold doping, trimming resistance values, altering junctions depth, and isolating regions.

6 Claims, 25 Drawing Figures

MONOLITHIC INTEGRATED CIRCUITS

This is a division of application Ser. No. 750,650 filed Aug. 6, 1968, now U.S. Pat. No. 3,655,457.

CROSS REFERENCES

IBM Docket 14,481, Monolithic Integrated Structure Including Fabrication and Package Therefor, by Benjamin Agusta et al.; and Ser. No. 428,733, filed Jan. 28, 1965.

1. Field of the Invention

This invention relates to monolithic integrated circuits, their structure and preparation, and more particularly to their fabrication utilizing ion implantation techniques.

2. Description of the Prior Art

Monolithic integrated circuits are presently made utilizing high temperature expitaxial growth and thermal diffusion techniques. As a result of the well known physical principles of diffusion, these high temperature processes result in serious limitations with respect to controlling circuit dimensions and characteristics.

In a typical thermal diffusion process, diffusion of the impurities not only occurs in depth away from the surface being treated, but also laterally along the surface and beneath the oxide mask. Because of this, allowance must be made for lateral spread by providing isolation regions in designing the circuit layout, the result being a circuit which is larger than one which would not have to allow for lateral spread of impurities during the diffusion process. Also, the lateral spread results in a higher junction capacitance than would be present otherwise.

Transistors made by solid state diffusion usually suffer low breakdown voltage because the impurity concentration is not constant throughout the junction. This difference in impurity concentration is caused by the difference in junction depth, the lateral diffusion junction depth being less than the vertical diffusion junction depth. The result is a higher impurity concentration at that portion of the junction nearest the surface of the device. Similarly, in the making of shallow high speed transistors by thermal diffusion techniques, the impurity gradient limits the capacitance of the emitter. To obtain higher speed transistors, the emitter capacitance must be reduced over that obtainable by thermal diffusion techniques.

A further disadvantage of thermal diffusion processes is that it is essentially impossible to change or tailor the impurity profile. For instance, in a double diffusion transistor any subsequent diffusion to alter or correct the impurity profile of one impurity type will result in changes to the other impurity profile. These inabilities to change or tailor an impurity profile without affecting the others is centainly a more severe problem when one deals with integrated circuits.

Gold is known to reduce the minority carrier lifetime in silicon diodes and transistors, thus increasing their switching speed. The lifetime killer (gold) atoms are needed only in the collector junction of a transistor, but present day techniques of introducing gold into silicon devices by solid state diffusion processes result in the gold being generally distributed throughout the device because of the very large diffusion coefficient of gold at various temperatures. Thus, gold is introduced into the base and emitter areas as well as at the collector junction. Furthermore, in the course of device fabrication, "PIPES" are created more frequently in the device because of the gold doping. PIPES are a structural defect in the base region making electrical shorting of the device during operation, and is thought to be caused by the interaction of phosphorous or boron with the gold during the high temperatures of the diffusion process.

A further disadvantage of high temperature thermal diffusion and epitaxial growth processes relate to the formation of a sub-collector junction for a transistor and integrated circuit. In such a process, high concentration arsenic or antimony impurities, for example, are diffused into a P-silicon substrate to form a localized N+ region for the sub-collector, then an expitaxial layer (N- type) is grown onto the diffused substrate. Base and emitter diffusions are subsequently given to the epitaxial layer to make the discrete transistor. The high temperature epitaxial growth steps cause diffusion of the sub-collector impurity, requiring that adjacent devices in integrated circuits be separated sufficiently for subsequent isolation diffusion steps.

Similarly, a further disadvantage of high temperature thermal diffusion and epitaxial techniques for the fabrication of transistors, diodes, capacitors, or resistors is the almost impossibility in a monolithic structure to build such circuit devices of a different type and/or the same devices of greatly different characteristics in immediately adjacent areas.

A further disadvantage associated with the high temperature processes heretofore used for the formation of monolithic integrated structures relate to the use of silicon dioxide (or its complex) as a masking material in the formation of planar type devices. Because of the high temperature required to form the silicon dioxide mask layer, previously diffused impurities in the silicon wafer are redistributed, resulting in alterations of the characteristics of the device and making extremely difficult the attainment of very critical dimensional or electrical specifications.

SUMMARY OF THE INVENTION

It is, therefore, an object of this invention to provide a process for forming integrated circuits which does not require temperatures high enough to result in thermal diffusion of the impurities within the device substrate.

It is a further object of this invention to provide a method for building integrated circuit devices which does not result in lateral diffusion of impurities.

It is a further object of this invention to provide a method for placing gold ions in the collector region of a transistor, and avoiding the formation of PIPES.

It is a further object of this invention to provide a method for making, in an integrated circuit, immediately adjacent and dissimilar devices without the need for isolation diffusion.

It is a further object of this invention to provide a method for correcting or altering an impurity profile (that is, achieving a higher concentration of impurity, or moving an impurity junction with respect to the surface of the device) without altering the profiles of other impurities in the device.

It is a further object of this invention to provide a method for achieving in integrated circuits an impurity concentration in excess of the solubility limit of the impurity in the substrate.

It is a further object of this invention to provide a method for achieving a constant impurity concentration throughout the horizontal and lateral junctions of an impurity region, and to provide a method for achieving a constant impurity concentration throughout an impurity region.

It is a further object of this invention to provide a method for trimming the characteristic values of discrete devices, such as resistors.

It is a further object of this invention to provide a method for building a transistor having an improved breakdown voltage by providing a constant impurity concentration from the emitter junction to the device surface.

It is a further object of this invention to improve the switching speed of a transistor through providing a method for achieving a deeper, narrower base widths than previously obtainable.

The invention is in a method for forming integrated circuits which have closely packed devices having unique electrical and dimensional characteristics. This is accomplished by heating a semiconductor substrate to a low temperature, and then ion implanting N type, P type, electrically neutral, and lifetime killer impurities into the regions comprising the various devices.

Some of the more significant steps of the invention are heating the substrate to a temperature sufficiently high to anneal the defects created during implantation yet sufficiently low that there is essentially no thermal diffusion or movement of impurity ions; ion implanting immediately adjacent regions to form the closely packed devices; varying the ion beam energy to implant essentially constant impurity concentration regions; ion implanting lifetime killer impurities into selected regions; ion implanting electrically neutral impurity ions into junction regions to give a steeper gradient; and ion implanting impurity ions into previously implanted regions to alter or trim the region characteristics.

Some additional significant steps of the invention for obtaining narrow base regions are ion implanting into the same region both N and P type impurities and then heating to cause one of the impurity types to diffuse out of the region, thereby forming a narrow base surrounding the emitter.

DETAILED DESCRIPTION

SUBSTRATE PREPARATION

Figure 1A:
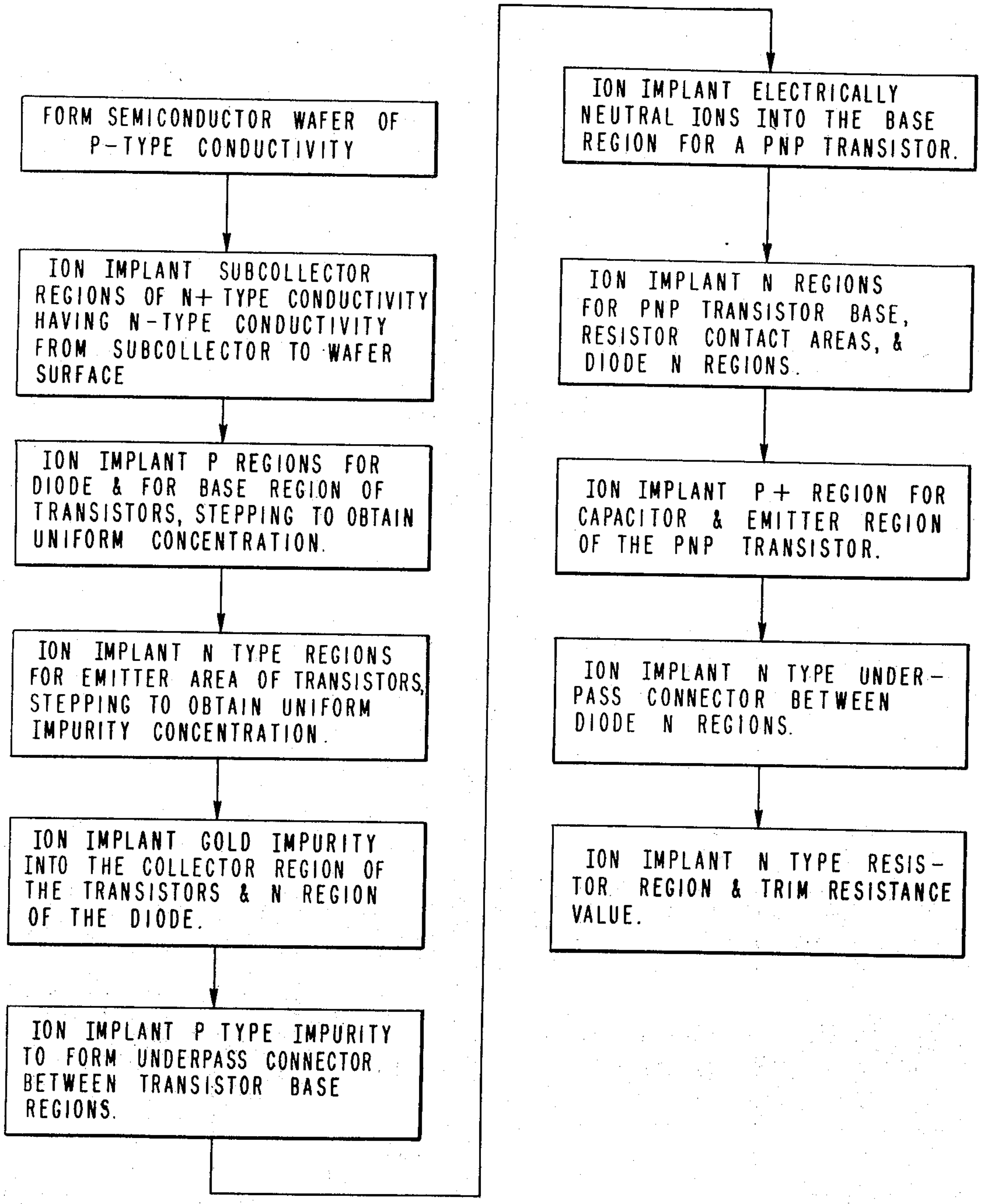
FIG. 1A is a flow diagram of an integrated circuit fabrication process using ion implantation techniques to build various discrete devices in a single wafer.

Discrete electronic devices and integrated circuits are produced by ion implantation techniques in monocrystalline substrates of silicon (Si), germanium (Ge), gallium arsenide (GaAs) or any other III–V or II–VI compound or other semiconductor.

Although for the purpose of describing this invention reference is made to a semiconductor configuration wherein a P- type region is utilized as the substrate and subsequent semiconductor regions of the composite semiconductor structure are formed in the conductivity type described, it is readily apparent that the same regions that are referred to as being of one conductivity type can be of the opposite type conductivity and furthermore, some of the operations which are described as diffusion operations can be made by epitaxial growth and some of the epitaxial growth regions can also be fabricated by diffusion techniques, and some of the operations which are described as diffusion or epitaxial growth operations can also be accomplished by ion implantation.

A wafer of P- type conductivity, preferably having a resistivity of 10 to 20 ohms-centimeter is used as the starting material. The substrate may be prepared for ion implantation in the same manner as it would be for thermal diffusion and epitaxial growth processes. In a preferred embodiment, the wafer is a monocrystalline silicon structure which is fabricated by conventional techniques, such as by pulling a silicon semiconductor member from a melt containing the desired impurity concentration and then slicing the pulled member into a plurality of wafers. The wafers are cut, lapped and chemically polished to 7.9 (plus or minus 0.8) mils in thickness. The wafers are oriented 4° (plus or minus 0.5°) off the (111) axis toward the (110) direction. It is understood, however, that ion impurities may be implanted into wafers of thicknesses and orientations differing from the above example.

In discussing the semiconductor fabrication method, the usual terminology that is well known in the transistor field will be used. In discussing concentration, references will be made to majority or minority carriers. By "carrier" is signified the free-holes or electrons which are responsible for the passage of current through a semiconductor material. Majority carriers are used in reference to those carriers in the material under discussion, i.e., holes in P type material or electrons in N type material. By use of the terminology "minority carriers" it is intended to signify those carriers in the minority, i.e., holes in N type material or electrons in P type material. In the most common type of semiconductor materials used in present day transistor structure, carrier concentration is generally due to the concentration of the "significant impurity," that is, impurities which impart conductivity characteristics to extrinsic semiconductor material.

Unless otherwise specified, when reference is made to an impurity of a "first type" and to an impurity of the "second type," it is to be understood that "first type" refers to an N or P type material, and "second type" refers to the other material. That is, if the "first type" is P, then the "second type" is N. If the "first type" is N, then the "second type" is P. In referring to a region containing an impurity concentration of P type, for instance, it is meant the "significant impurity" is a P type, and that the majority carriers are holes.

Figure 7:
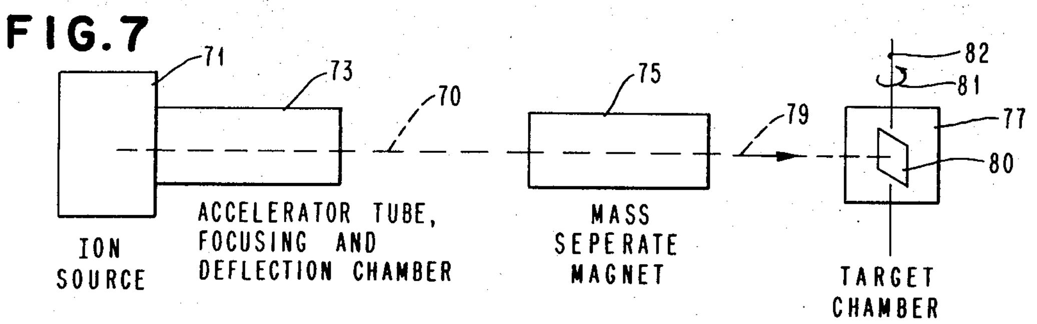
FIG. 7 is a diagrammatic view of an apparatus for ion implantation.

The ions which may be implanted in the wafer 80 in FIG. 7 are no long limited by solubility or other chemical consideration, which considerations precluded, for example, thermal diffusion of nitrogen ($N_2$) into a semiconductor.

Therefore, the N type impurities to be used in the ion implantation processes to be described included germanium, silicon, Group V elements from periodic table, nitrogen, or any other element which forms N type impurity when implanted in the lattice structure of the substrate. Similarly, P type impurities to be used in the ion implantation process include boron, indium, gallium, Group III elements from the periodic table, or any other element which forms a P type impurity when implanted in the lattice structure. Generally, 5 to 15 minutes of bombardment is required to implant $10^{15}$ to $10^{20}$ atoms/cm$^3$. The impurity density achieved is not limited by the diffusion coefficients of the materials, as in thermal diffusion techniques.

ION IMPLANTATION

Throughout the following description of the invention, regions and channels of electrically active impurities of the first or second type, electrically inactive impurities, and lifetime killer impurities are implanted in a monocrystalline substrate. These regions and channels are placed in said substrate to build discrete semiconductor devices for integrated circuits. The organization of the regions depends upon the specific integrated circuit to be produced.

Generally speaking, a region may be ion implanted within a substrate at the surface or wholly buried beneath the surface. Such a region may be implanted within the original unaltered substrate or within a previously implanted region.

Referring to FIG. 7, an apparatus is generally disclosed for providing an ion beam for implanting impurity ions in a semiconductor. Briefly, an atom of some element is ionized in ion source 71 and accelerated by a potential gradient through accelerator 73 to obtain an energy high enough to be implanted in target 80 in target chamber 77.

Since beam 79 of particles is charged it is affected by magnetic and electric fields and thus may be focused and deflected in chamber 73 or by mass separate magnet 75.

In order to prevent surface damage from cold working by the ion beam, the target wafer 80 to be implanted is maintained at a temperature of 100° to 600° C., well below the diffusion temperature of the impurities to be implanted. A substrate temperature range of 300°–500° C. is preferred in order to accomplish annealing of damage during the implantation. In the region of 600° C. and higher the temperature gives certain ions too much mobility, thereby unduly expanding the implanted regions. In the region of 100°C. and lower, the annealing effect is insufficient to correct structural defects created by the implantation. While the preferred process described requires that the substrate be heated during the implantation steps, it is to be understood that the annealing may be done after implantation.

The depth to which the ions of beam 79 are implanted in target 80 is a function of ion beam energy and the angle of incidence of said beam with respect to the target 80. The angle of incidence may be controlled, for instance, by rotating target 80 about axis 82. Generally, an ion beam with an energy of 1 kev to 4 mev is sufficient for implanting impurities in the substrate.

A number of methods are available for controlling the area of implantation. Because the ion is affected by magnetic and electric fields it may be focused and deflected electrostatically in such a manner as to trace out or describe the area to be implanted. A second method would be to provide a mask (not shown) in collimated ion beams 79, which mask selectively blocks out portions of the ion beam 79, thus providing areas of implantation on target 80.

A third method for controlling the areas of implantation is through the use of masking the substrate surface with a photoresist material. By techniques well known in the art a photoresist polymer may be selectively applied to the surface of the wafer. The thickness of the photoresist layer to be applied over the areas of target 80 where ion implantation is not desired depends upon the energy of the ion beam 79. Also, any material which may be laid in a thin film upon the surface of the wafer may be used to mask the areas of the wafer on target 80 which are not to be implanted. Particularly, a metal film could be used.

The great advantage in being able to use photo-resist as a masking material during the implantation process relates to the low temperatures required to apply the photoresist layer. Previously, amorphous silicon dioxide, or its complex, has been used to mask or stop the implantation of various ions in silicon for masking junctions through thermal diffusion techniques. Silicon dioxide or its complex is usually obtained by oxidizing silicon at high temperature in the presence of steam or oxygen. Because of this high temperature process, the previously implanted ions are redistributed in the silicon, thereby altering the characteristics of the device. The use of photoresist or other masking layers applied at lower temperatures does not cause diffusion of ions previously implanted in the device.

FORMATION OF IMMEDIATELY ADJACENT REGIONS

A primary advantage of the invention is the formation of immediately adjacent impurity regions and devices in integrated circuits. The concept of "immediately adjacent" is described and defined in the following paragraphs.

Before defining "immediately adjacent" as it is intended to be used for this invention, it is important to understand some inherent characteristics of thermally diffused and ion implanted regions.

In thermal diffusion of impurity regions through an oxide mask or the substrate surface, diffusion occurs both vertically into the substrate and laterally beneath the oxide mask. If two impurity regions are diffused through a mask separating the regions by 0.5 mils, the maximum depth of regions possible before they laterally diffuse together under the mask is about 0.25 mils. If deeper regions are required, they must be more widely separated at the surface by the mask. Thus, two thermally diffused regions are separated at their deepest point by the width of the mask, and are separated at the surface by the width of the mask less twice the depth of the regions. In general, thermally diffused regions must be separated by more than twice the depth of the regions, as measured at their deepest point.

In ion implantation of a region through a photoresist mask on the surface of the substrate, implantation only occurs vertically, there being essentially no lateral displacement of impurity. If two impurity regions are ion implanted through a mask separating the regions by 0.5 mils the regions may be implanted to any depth and will be separated by 0.5 mils throughout the length of that depth. Similarly, if two regions are implanted by focusing and deflecting the ion beam or moving the substrate to control the target area, the distance between two regions is constant throughout their depth and the same as at the surface, or target area. The distance between ion implanted regions may, therefore, be made as small as the mask permits (currently, the minimum mask separation is about 0.2 mils) or as the focusing, deflecting, and moving apparatus permits. Distance between regions of 2,000 – 5,000 angstroms are theoretically possible using ion implantation, and that irrespective of the depth of the regions.

Therefore, for purposes of this invention, "immediately adjacent" regions are defined as those separated by a distance less than twice the depth of the shallowest region. When the regions have been implanted through a mask, that distance is measured by the width of the mask between the regions.

FORMATION OF STEEP GRADIENTS AND ESSENTIALLY CONSTANT IMPURITY CONCENTRATION REGIONS

Another primary advantage of the invention is the formation of deep impurity regions having high, essentially constant impurity concentrations and steep gradients at the junctions. The concepts of "high," "steep" and "essentially constant" will be described and defined in the following paragraphs.

In this section, the characteristics of a single region will be described. In following sections, the combinations of essentially constant, deep regions having steep gradients to form narrow base regions and constant impurity concentration profiles will be described. The combination of immediately adjacent devices having regions and junctions of the above noted characteristics is the essence of the invention.

Figure 3A:
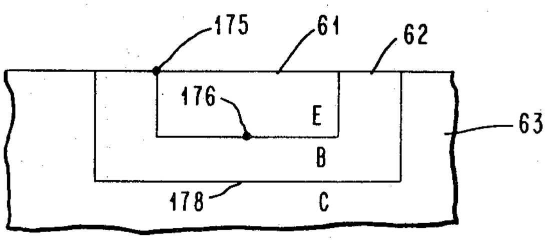
FIG. 3A is a cross section of a typical transistor showing the emitter, base and collector regions and junctions.

Referring to FIG. 3A a diagrammatic cross section view of a transistor is shown. Emitter region 61 is contained within base region 62 which is further contained within collection region 63. The collector base junction is formed along line 178, while the emitter base junction exists along the line containing points 175 and 176.

Figure 3B:
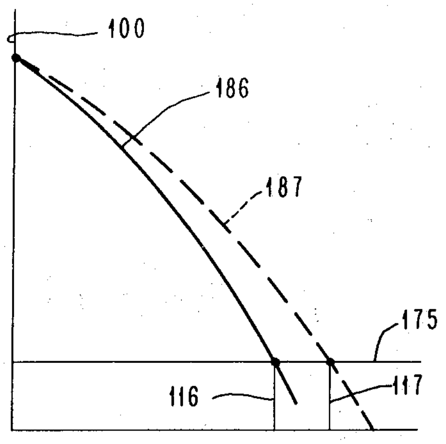
FIG.3B (PRIOR ART)
FIG. 3B is an impurity profile chart showing the change in impurity concentration profile as additional impurity is diffused into a wafer using thermal diffusion techniques of the prior art.

Referring to FIG. 3B, the impurity profile of a thermally diffused region along a line through the center of the region (as, for example, through point 176 of FIG. 3A and perpendicular to the surface) is shown. This figure will be used to illustrate the limitations of the prior art, and overcome by the process of ion implantation, with respect to concentration profile of a region.

In thermal diffusion, the impurity concentration profile 186 is limited by the laws of diffusion to the general shape shown, and having the following characteristics:

1. the concentration of impurity atoms at the surface 100 cannot exceed the solubility limit of the impurity in the substrate at the temperature of diffusion,
2. the concentration of the impurity atoms at any point within the substrate is less than at the surface of the region exposed to the diffusant, and
3. the impurity concentration profile can only be made steeper by making it shallower, for a given surface concentration and impurity atoms.

The impurity profile of a thermally diffused region is considerably more complicated along the sides of the region where lateral diffusion occurs, but analogous characteristics describe that profile.

Figure 3C:
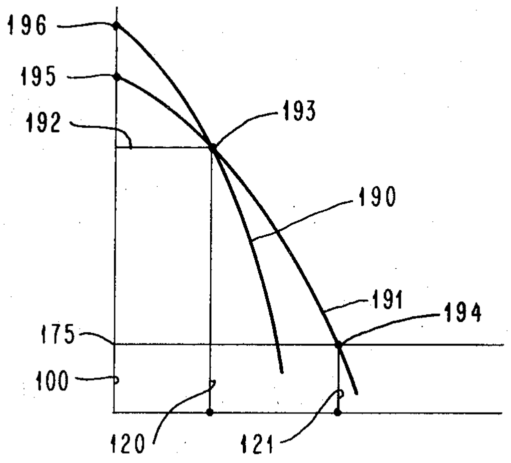
FIG.3C (PRIOR ART)
FIG. 3C is a typical impurity profile for a double diffused transistor of the prior art.
Figure 3D:
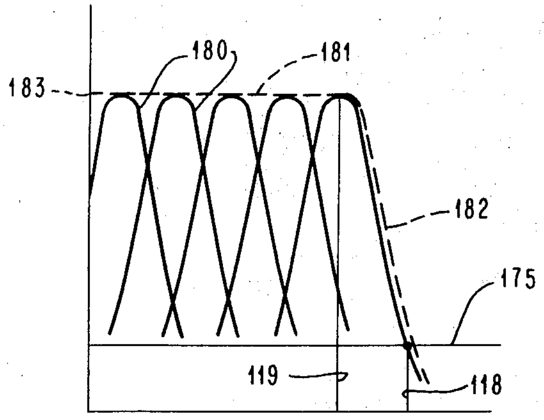
FIG. 3D is an impurity profile showing the resultant impurity profile from a series of ionic implantation steps at varying implantation energies.

An essentially constant impurity concentration throughout a region may be obtained by ion bombardment. Referring to FIG. 3D, a region having an essentially constant impurity concentration 181 throughout the region from the surface to the beginning of the steep gradient 182 is shown. Regions 180 of the same impurity type are implanted at various distances beneath the surface of the substrate by varying or stepping the bombardment energy for each said region 180. The energy may stepped from low to high, or from high to low. The net result will be the impurity concentration profile 181/182.

Referring to FIG. 3A, for example, if the region described in the preceding paragraph is the emitter region 61, then the impurity concentration 181 in region 61 is constant throughout region 61, and more particularly at both the surface 175 and at the point 176 at a depth 119.

Furthermore, the gradient 182 is formed by the distribution of ion energies within a beam held at the energy for implanting the deepest region 180. Because there is no thermal diffusion of ions out of the position they originally occupy in the crystal lattice, gradient 182 is much steeper than gradient 186 for a given region depth (where depth 116 equals depth 118) and surface concentration (where concentration 183 is the same for profile 186 at surface 100.)

Also, the impurity concentration 183 formed by ion implantation is not limited by the solubility limit of the impurity in the substrate and thus, concentration 183 may be made very much greater than that of profile 186 at surface 100.

Furthermore, in ion implantation, there is no necessary inverse relationship between the depth 118 and the steepness of the gradient 182. Depth 118 could be moved further from the surface by ion implanting another region 180, and the new gradient 182 (not shown) would be as steep as the old.

Figure 4:
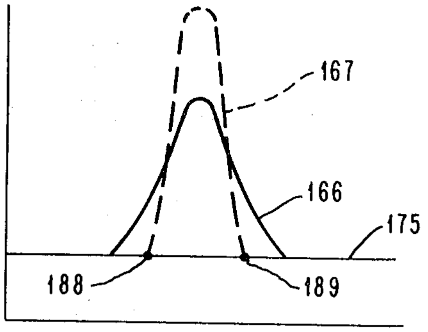
FIG. 4 shows the resulting steeper impurity profile when an electrically active ion is implanted into an area where an electrically inactive substance has been previously implanted.

A combination of two ion implantations can result in gradient even steeper than gradient 182, described above. Referring to FIG. 4 in connection with FIG. 3D, this method will be described. A first species of ion impurity is implanted to form profile 166 beneath the surface of the substrate. Next, a second species of ion impurity is implanted into the same area to form profile 167. If the first impurity is electrically inactive (such as helium or another inert gas) and the second impurity is electrically active (such as phosphorous or arsenic, etc.) an even steeper gradient of electrically active impurity can be achieved, thus reducing the neutral capacitance of the emitter structure even more than by ion implantation of a single impurity. By first bombarding with an inactive material 166, the interstitial and substitutional locations of the crystal are occupied, and also, the crystal structure is slightly changed to a more amorphous state. Such a densely packed, slightly amorphous host material will stop and contain the active impurity 167 in a narrower band for a given implantation energy, and the impurity density of the electrically active substance will be higher at its peak than it would have been without an inactive impurity prebombardment.

Thus, an even steeper gradient 182 may be obtained by first implanting an electricaly neutral impurity into the deepest region 180.

Therefore, in the discussions which follow, the following definitions apply:

A "high concentration" of impurity ion in a region beneath the surface is a concentration in excess of the solubility limit of the ion in the substrate.

An "essentially constant" impurity profile is one where the impurity concentration throughout the region is essentially equal to that at the surface of the region.

A "steep gradient" is a gradient which has a maximum concentration at a point beneath the surface of the substrate.

CONSTANT IMPURITY CONCENTRATION EMITTER-BASE JUNCTION FORMATION

Low breakdown voltage in double diffused transistors results from difference in impurity concentrations along the base-emitter junction. Referring to FIG. 3A, the base impurity concentration at 176 is less than that at 175, due to the principles of thermal diffusion discussed previously. Referring to FIG. 3C (with FIG. 3A,) the base impurity concentration 192 at junction 193 (or 176) is less than that at 195 (or 175). As the breakdown voltage is related to impurity concentration, the effective breakdown voltage of the transistor is controlled by the concentration 192 at junction point 193 (176).

The prior art attempted to improve the breakdown voltage by increasing the concentration of 193 by making the emitter region narrower, or by moving the emitter junction closer to the surface. For example, the prior art transistor is shown in FIG. 3C. Assume an N-P-N transistor structure having a silicon base with an N type impurity such as arsenic phosphorous and antimony at a concentration level 175 of about $10^{16}$ atoms/cm$^3$, and a base region of a P type impurity such as boron with a concentration gradient decreasing with depth away from a surface density 195 of approximately $10^{19}$ atoms/cm$^3$, and having an emitter region of N type impurity such as phosphorous having a surface concentration 196 of approximately $10^{21}$ atoms/cm$^3$. In such a device the base has a width from 120 to 121 of about 0.5 microns, the collector-base junction 194 being at a depth 121 of about 1. to 1.5 microns and the emitter base junction 193 having a depth 120 of about 0.5 to 1.0 microns. Heretofore, by thermal diffusion techniques, the shallowest emitter junctions 193 obtainable were in the range of 0.5 to 1.0 microns.

Figure 3E:
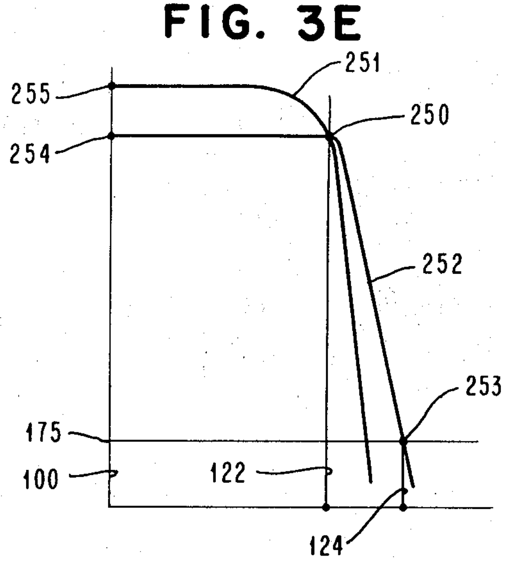
FIG. 3E shows the impurity profile obtainable using ion implantation to form steep gradients deep below the wafer surface.

However, referring to FIG. 3E, with the process of the invention, one can implant ions of an N type impurity to form an emitter-base junction 250 from 0.2 to 0.3 microns in depth. Also it is possible to make the P type impurity gradient 252 steeper and additionally the width 122 to 124 of the base narrower through ion implantation techniques than was possible in the prior art. Stepping of the implantation of the emitter region impurity is required in order to insure that sufficient N type impurity is implanted throughout the emitter region so that the majority carriers are electrons.

However, a serious disadvantage of a shallow emitter region is the exposure to destruction by surface damage. The method of the invention for obtaining a high breakdown voltage with a deep emitter will next be described.

FORMATION OF NARROW BASE REGIONS

As is well known in the art, the optimization of transistor characteristics with a high breakdown voltage and a very fast switching speed depends upon achieving a very narrow base width and a high emitter-base junction impurity profile. In this section the processes of the prior art and of the invention for achieving a very narrow base width are described. The process of the invention for achieving a constant impurity profile along the base-emitter junction was described in the preceding section.

Essential to the achieving of a very narrow base width is the formation of very steep base region impurity gradient between the emitter-base and base-collector junctions.

Referring to FIG. 3C, the difficulty in achieving a very narrow base width by use of thermal diffusion steps is illustrated. The transistor of FIG. 3C is formed by thermally diffusing a P type impurity 191, such as boron, in a silicon wafer, having an N- impurity (e.g., phosphorous) concentration 175. Subsequently, an N type impurity 190, such as phosphorous is implanted to form the emitter region. The emitter-base junction 193 at a depth 120 and the collector-base junction 194 at a depth 121 below wafer surface 100 define the base region.

The surface concentration 196 of the phosphorous impurities of the emitter region is limited by the solubility between said impurity and the silicon substrate. Assuming a diffusion at 1200° C, the concentration limit is about $1.0 \times 10^{21}$ atoms/cm$^3$. This concentration limit is achieved at the surface only; the concentration profile follows roughly the temperature gradient and also depends upon the time of diffusion.

Similarly, the impurity concentration 191 of the boron base region descends from a maximum concentration 195 through a generally sloping gradient.

The primary method of the invention for improving the breakdown voltage accomplishes the result by making the impurity concentration constant throughout the emitter-base junction: that is, the impurity at junction 175 equal to the impurity concentration at junction 176. Each subsequent implantation of the impurity for, say, the emitter region is conducted at a decrease (or an increase) in implanting energy. Referring to FIG. 3D, regions 180 are implanted at varying bombardment energies. The resultant impurity concentration 181 approaches a constant value through the various levels of the region with respect to the surface and a true or maximum effective breakdown voltage is obtained. The breakdown voltage at the junction nearer the surface i.e., at 175, is the same as the breakdown voltage which is furthest from the surface, i.e., 176. Thus, through the stepping process of the invention, referring to FIG. 3E a constant impurity concentration is achieved throughout the emitter base region from the surface 100 to the junction 250.

A higher breakdown voltage is obtainable through the method of the invention not only because of the impurity profile is constant throughout the junction, but also because the impurity concentration may be established higher than the solubility limitations imposed in the thermal diffusion processes. Comparing FIGS. 3C and 3E, for example, the impurity concentration of emitter base junction 250 through ion implantation is not only higher than the emitter junction 193, but may also be made higher than the impurity concentration at 196.

Referring to FIG. 3E the impurity profile for the emitter and base region are shown as achieved by ion implantation process of the invention. Note that the emitter gradient 251 and the base impurity gradient 252 are very steep in the base area between the emitter junction 250 and the collector junction 253, thus forming a very narrow base region defined between depths 124 and 122.

The process for achieving such steep gradients, described previously for a single region, will next be described for a transistor.

Referring again to FIG. 3A, in the first method of the invention for forming steep emitter and collector gradients, an N type impurity is ion implanted in a substrate 63 having a P- impurity concentration to form the base region 62, and subsequently a P type impurity is implanted to form the emitter region 61. Referring to FIG. 3E, the P type emitter 251 formed by ion implantation may have a very high concentration both at the surface 255 and at the base emitter junction 250, because said concentration is not limited by the temperature solubility of the impurity in the silicon substrate. Similarly, a very high concentration of N- type impurity, also not limited by solubility of the impurity, may be provided both at the surface 254 and at the base-emitter junction 250 of the base region 252. Through the ion implanation steps of the invention the impurity may be implanted at a concentration exceeding that of the established solubility and is not limited by the temperature gradient. Because both the emitter impurity profile and the base impurity profile are very steep between junctions 250 and 252, the base width is very narrow.

The second method, for using ion implantation steps of the invention for providing even steeper gradients involves the interaction between electrically active and inactive species described previously.

Referring again to FIG. 3E, a very narrow base region can be formed deep beneath the surface. Emitter junction 250 is at a depth 122 which is, for example, 3 microns, or even more below the surface 100 of the water. To achieve a depth for the emitter junction 250 of this magnitude using thermal diffusion techniques, one would have to start the P type gradient 251 from a surface concentration 255 which is impossible because of the solubility limitations, or else sacrifice the narrow base region required to achieve a satisfactory speed of the device. The ability of the ion implantation process of the invention to place an emitter junction far below the surface while maintaining a narrow base region permits the fabrication of a transistor having optimum electrical characteristics while providing protection against surface damage. For instance, the transistor of FIG. 3E formed by this invention would have an emitter 251 with surface concentration 255 in excess of $10^{21}$ ions/cm$^3$ while the emitter base junction 250 has a constant impurity concentration 254 in excess of $10^{19}$ atoms/cm$^3$ from the surface 100 to emitter base junction 250. Emitter base junction 250 is at a depth 122 in excess of 3 microns while collector base junction 253 is at a depth 124 in excess of 3.5 microns.

Figure 6A:
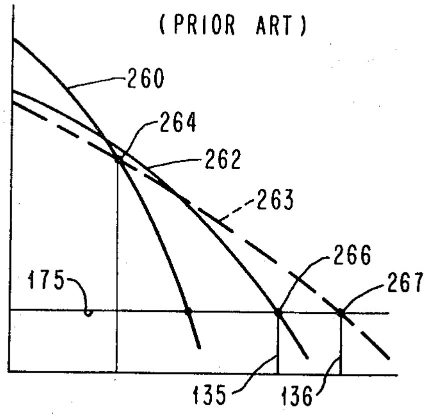
FIG. 6A is an impurity profile chart showing the movement of the base-collector junction during the prior art process of thermal diffusion of the emitter region.
Figure 6B:
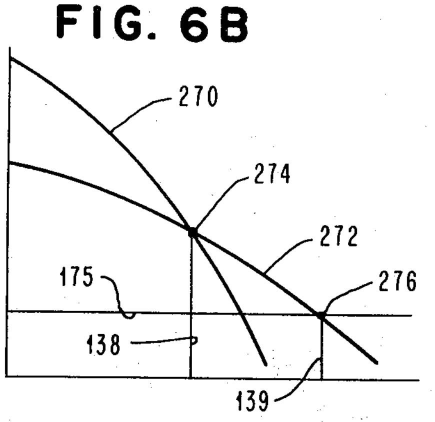
FIG. 6B is an impurity profile chart showing that the base-collector junction does not move during ion implantation of the emitter region.

Referring to FIG. 6A, an impurity concentration profile through the emitter and base regions of a transistor is shown. Typically, thermal diffusion of base impurity 262 is followed by a subsequent thermal diffusion of emitter impurity 260. Because, during the diffusion of the emitter 260, the base impurity profile moves from position 262 to 263, a movement of the collector base junction from position 266 to position 267 results. In such doubled diffused transistors, control of base width is extremely difficult because of this movement of the collector base region during diffusion of the emitter. Referring to FIG. 6B, an impurity profile chart demonstrates the process of the invention for forming a transistor structure having a base emitter junction at 274 and a collector base junction at 276. First, the base impurity profile 272 is implanted forming a collector base junction at 276. Subsequent ion implantation of emitter impurity 270 does not cause movement of the base collector junction 276. Thus, the base region from 139 to 138 is carefully controlled using the process of the invention.

Figure 2A:
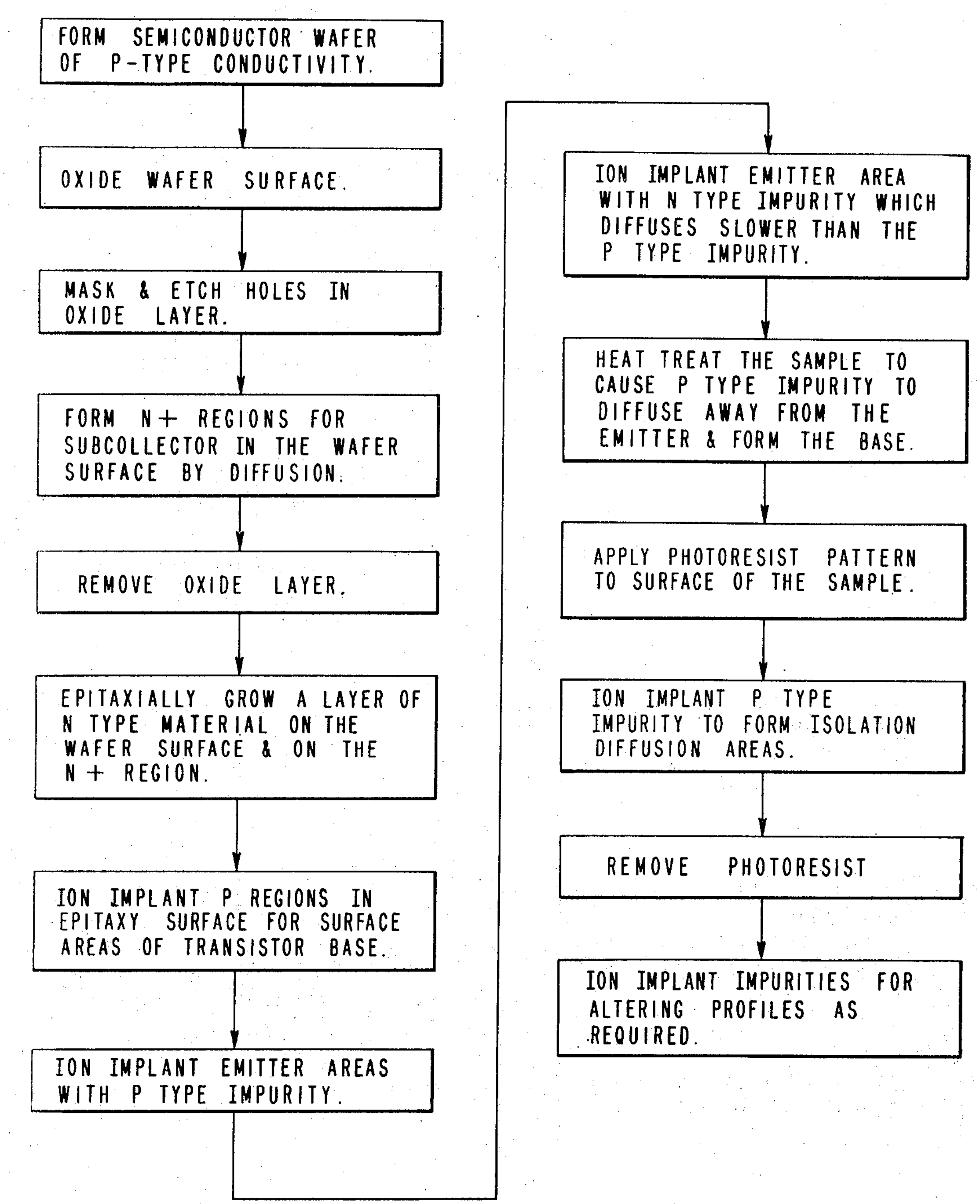
FIG. 2A is a flow diagram of an integrated circuit fabrication process combining ion implantation with thermal diffusion and epitaxial growth techniques for building transistor devices with very narrow base regions.
Figure 2B:
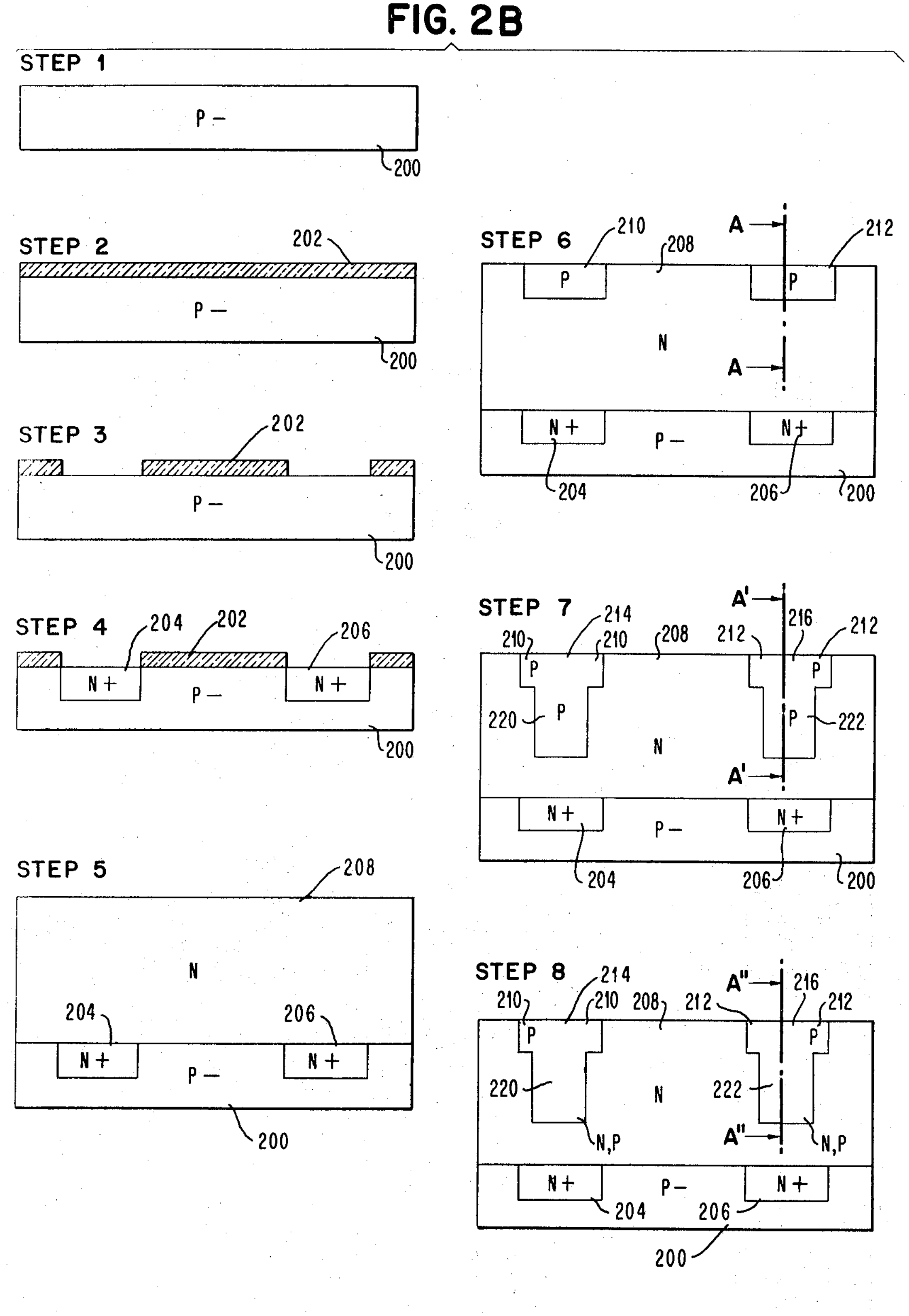
FIG. 2B is a flow diagram in cross section of steps 1 through 8 of the fabrication process of FIG. 2A.
Figure 2C:
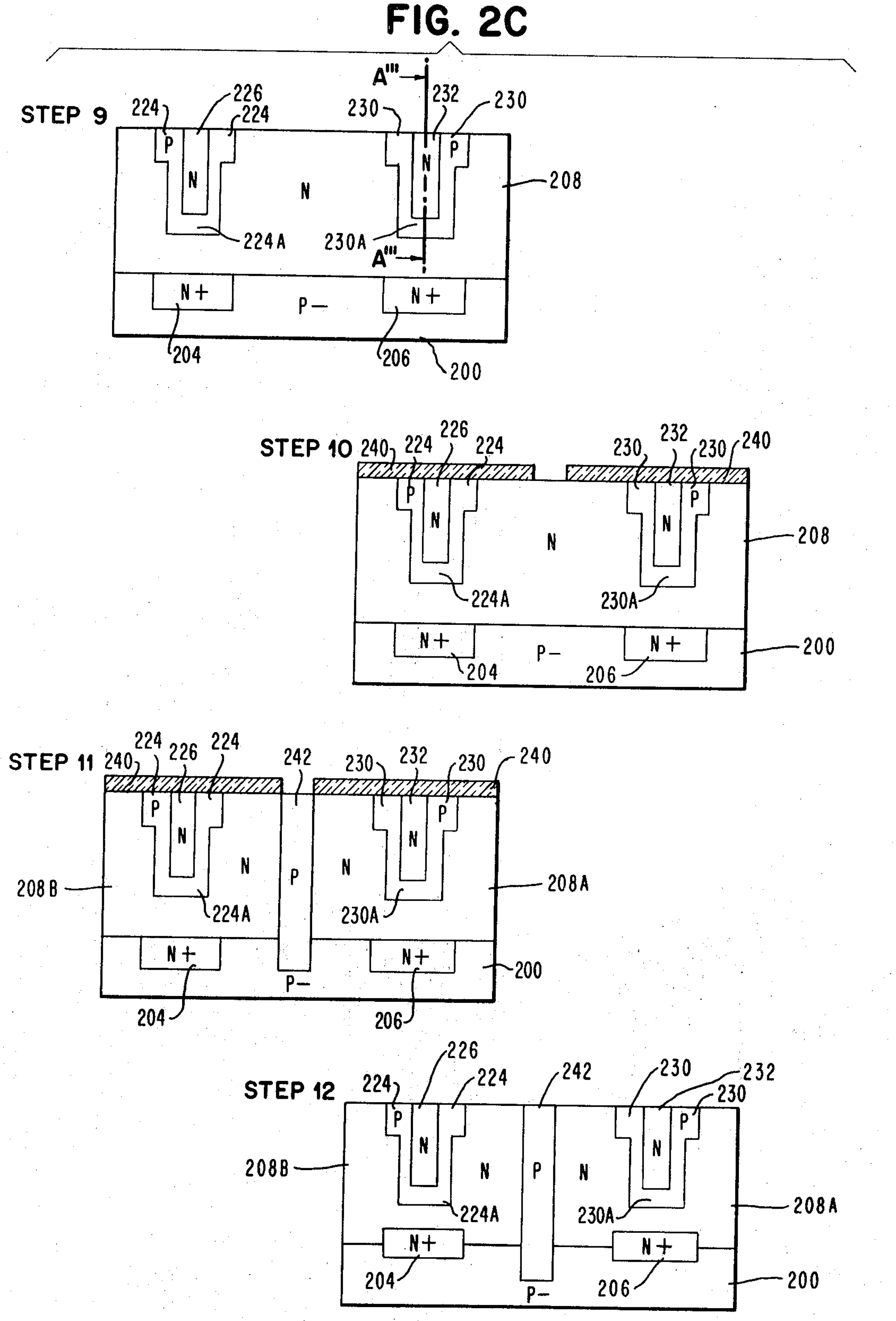
FIG. 2C is a flow diagram in cross section of steps 9 through 12 of the fabrication process of FIG. 2A.

Still another embodiment of the invention for forming a very narrow base width and a high concentration base-emitter junction is described in FIGS. 2B and 2C, steps 6 through 9. In N type substrate 208, a shallow P region 212 is first implanted. Through region 212, P region 222 is implanted. Next, an N type impurity which diffuses slower than the P type is implanted into region 222. Next the substrate is heated to cause the P type impurity to diffuse out of region 222 to form an N type region 230, 230A. Region 230A is a very narrow base region, with a high impurity concentration throughout its junction with emitter region 232.

Figure 2D:
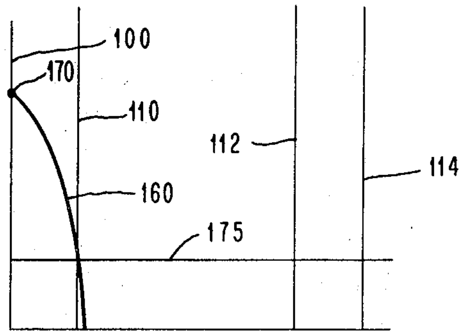
FIG. 2D is an impurity profile chart showing the impurity concentration through section A—A of FIG. 2B, step 6.

Referring to FIGS. 2D–2G, impurity concentration profiles demonstrates the manner in which the high speed transistor structure (described above, FIGS. 2B and 2C, steps 6–9) of the invention is formed. In FIG. 2D, the P type impurity is implanted to a depth 110 from a surface concentration 170.

Figure 2E:
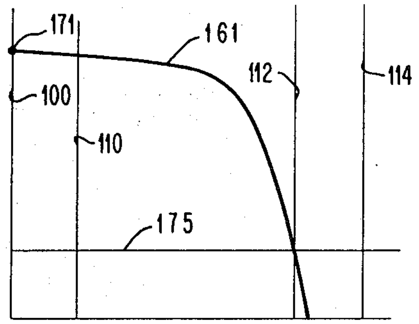
FIG. 2E is an impurity profile chart showing the impurity concentration through section A′—A′ of FIG. 2B, step 7.

In FIG. 2E, the same impurity type is implanted to a depth 112, causing the surface impurity concentration to rise to level 171.

Figure 2F:
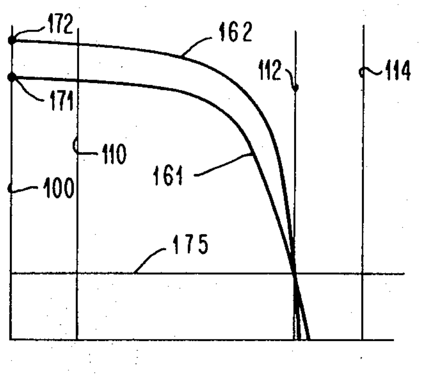
FIG. 2F is an impurity profile chart showing the impurity concentration through section A″—A″ of FIG. 2B, step 8.

In FIG. 2F, N type impurity 162 is implanted to the same depth as that of P type impurity 161, i.e., depth 112. The surface concentration of N type impurity 162 is 172.

Figure 2G:
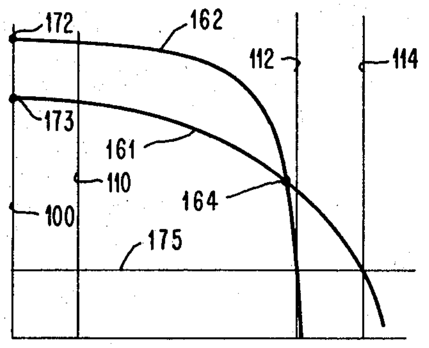
FIG. 2G is an impurity profile chart showing the impurity concentration through section A‴—A‴ of FIG. 2C, step 9.

Referring finally to FIG. 2G, as N type impurity 162 does not diffuse at the temperature for heat treatment of the device, while P type impurity 161 does diffuse, as the device is heat treated the P type impurity 161 diffuses to a depth 114, while the surface concentration drops to value 173.

The resulting base width 114–112 can be very closely controlled by controlling the temperature and time of heat treatment.

In summary of the previous two sections, the process of the invention permits the construction of a transistor having high concentration and deep junctions, steep gradients and narrow base widths. The resulting is a very fast transistor with a high breakdown voltage that is also less sensitive to surface damage because the junctions are deep in the substrate.

FORMATION OF LIFETIME KILLER IMPURITY REGIONS

It is well known in the semiconductor manufacturing art to dope semiconductor structures with carrier lifetime lillers such as gold. In order to reduce carrier lifetime, the killing impurities form recombination regions in the semiconductor body, thereby decreasing the lifetime of the carriers to permit either faster transistor switching operations or quick turnoff. However, it was discovered that in applying the use of carrier lifetime killers channels or "PIPES" were somehow formed between regions of the same conductivity type such as between the diffused emitter and the collector regions of a transistor, thereby shorting out these two regions and destroying the operation of the transistor device. Thus, PIPES are a structure defect in the base region which make possible electrical shorting of the device during operation, and is thought to be caused by the interaction of phosphorous or boron with the gold during the diffusion process. The lifetime killer or gold impurity is needed only in the collector junction of a transistor; however, present day techniques (i.e., solid state diffusion) for introducing gold into silicon devices result in the gold being generally distributed throughout the device. This result follows from the diffusion characteristics of the gold; i.e., a very large diffusion coefficient at the various diffusion temperatures.

In the formation of integrated circuits having, for example, as many as 144 components on an individual chip, the PIPE defect resulting in a high loss of yield is extremely critical. Not only is the individual device where the PIPE formed destroyed, but in addition, the entire monolithic structure is rendered inoperative. The yield in producing monolithic integrated structures without solution of this type of problem was approximately zero percent.

Through the ion implantation process of this invention, however, the gold impurity is implanted into the collector junction exclusively, reducing the minority carrier lifetime and thus increasing its switching speed. Furthermore, this ion implantation prevents the interaction of phosphorous or boron impurities in the base region with the implanted gold since the gold is only placed in the collector junction of the device. Because the entire integrated circuit is built with the low temperature processes of the invention, the temperature of the wafer will never reach that point where the gold will diffuse out of the collector region into the base region. For instance, a gold implanted region with a width of about 1.0 microns beyond the collector base junction is possible using ion implantation. If high temperatures are used in the process (as discussed in Example 2, below) it is only necessary that lifetime killer impurity implantation be done following the high temperature steps.

UNDERPASS CONNECTOR CHANNEL FORMATION

In fabricating integrated structures, a significant savings in cost is realized if all the connectors or lands that are formed on an insulating layer disposed over this surface of the integrated structure are in one plane. This is an extremely difficult goal to achieve when working with very densely populated integrated structures employing large numbers of active and passive elements. Consequently in order to prevent the use of multiple layers of conductive lands separated by insulating layers, it is necessary to provide low resisitivity underpass connectors in the integrated structure, connecting up the devices in the integrated structure.

Furthermore, the connector should occupy as small a planar area as possible, thereby reducing the amount of semiconductor area required therefore and also resulting in a reduction in capacitance and an increase in the figure of merit. (The figure of merit is defined as the reciprocal of the resistance times the capacitance.)

The use of a connector formed by base or emitter diffusion or a combination of both diffusions in an epitaxial region does not provide a good connector because the resistivity value is usually higher than what is to provide optimum conducting properties. Furthermore, since the connector system region is formed by a diffusion operation this could result in PIPES being formed which could short to a region of the same conductivity type as the connector. As used here, PIPES is a term of the art referring to channels of diffused material formed usually in fault areas of a semiconductor structure which reach undesired regions in the structure.

Figure 1B:
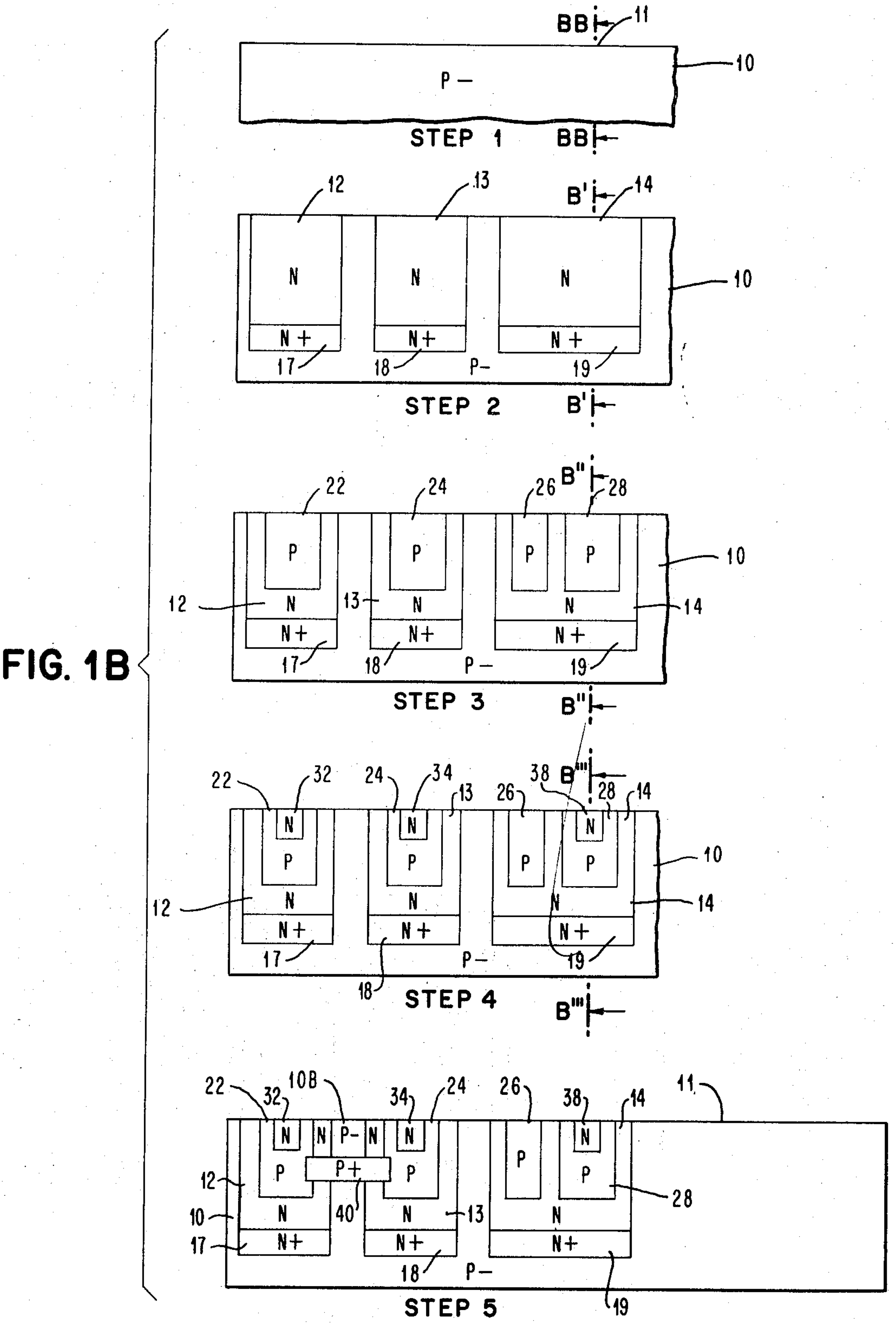
FIG. 1B is a flow diagram in cross section of steps 1 through 5 in the fabricating process of FIG. 1A.
Figure 1C:
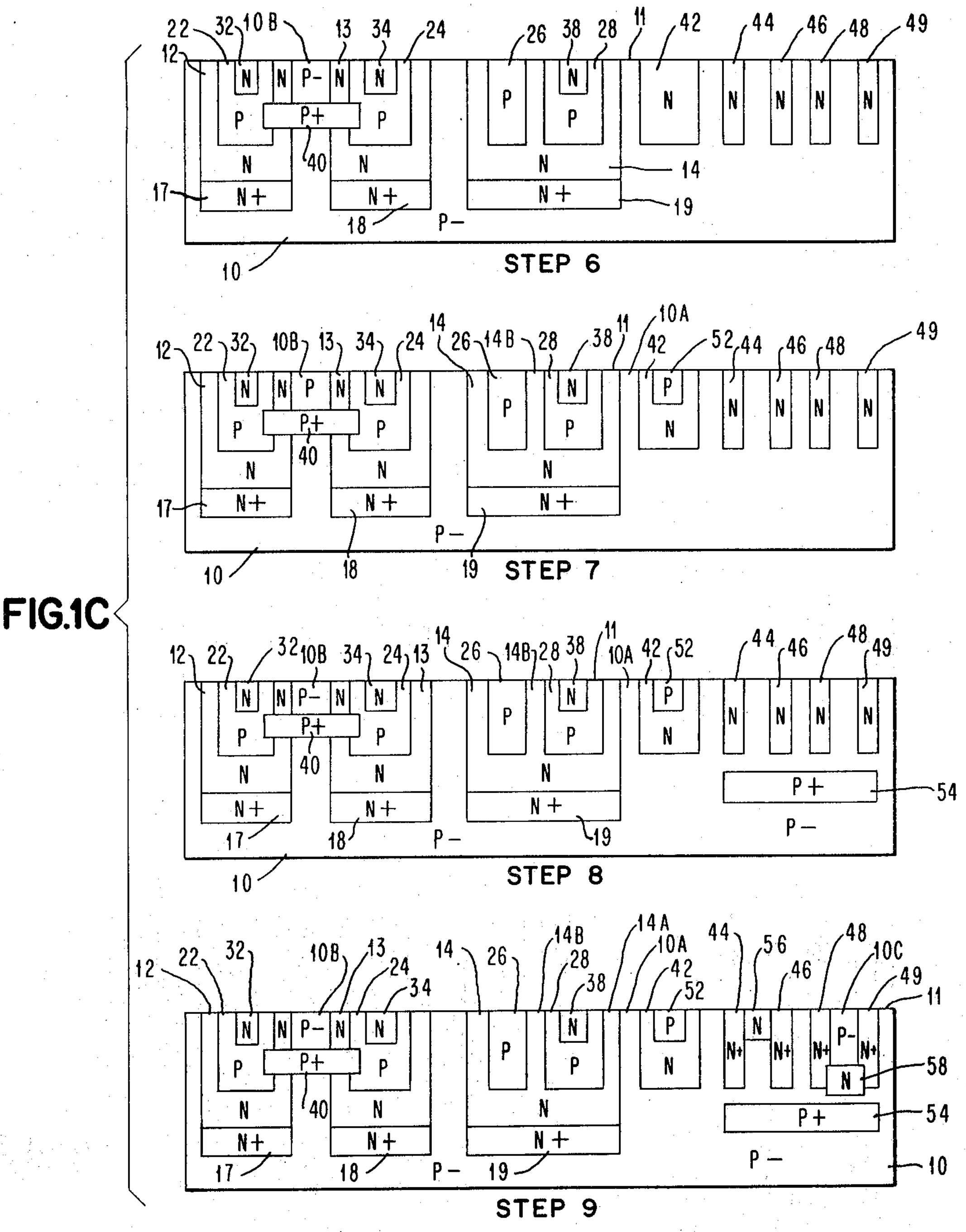
FIG. 1C is a flow diagram in cross section of steps 6 through 9 of the fabrication process of FIG. 1A.
Figure 1D:
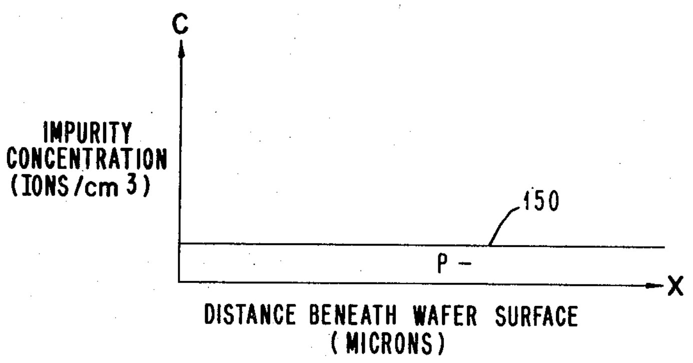
FIG. 1D is an impurity profile chart showing the impurity profile through section B—B of FIG. 1B, step 1.
Figure 1E:
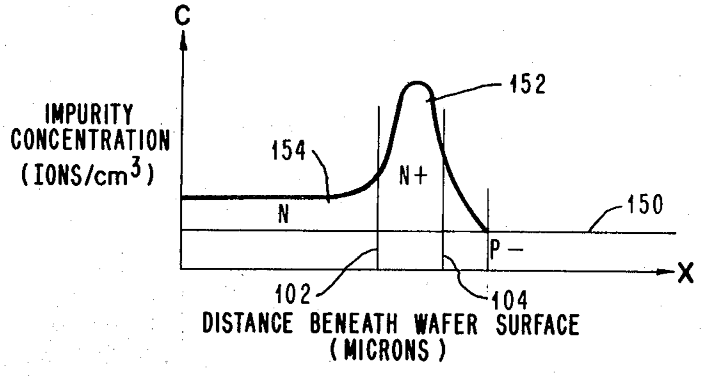
FIG. 1E is an impurity profile chart showing the impurity profile through section B′—B′ of FIG. 1B, step 2.

Referring to FIG. 1B step 5 and FIG. 1C, step 9, the method of the invention for providing an underpass connector is illustrated. Ion implanted profiles typically have a peak at some distance beneath the surface as is illustrated in FIG. 4, unless stepped as is illustrated in FIG. 3D. Because of this it is possible to form two junctions with one implantation. The resulting profile provides an isolated N or P region surrounded by semiconductors of the opposite type. This channel below the surface is used to provide connections between passive or active components. For example, in FIG. 1C, step 9, underpass connector 58 of an N type material connects N+ regions 48 and 49 thereby interconnecting the two diodes. The N region 58 is implanted within the substrate having a junction with both P- region 10 and also P- region 10C. Similarly, in underpass connector 40 and P type impurity is implanted connecting base region 22 and 24 of adjacent NPN transistors. Referring to FIG. 4 a typical concentration profile is 167 is shown for an impurity which has been implanted at a distance beneath the surface so as to form two junctions 188 and 189 within the device.

RESISTOR FORMATION AND TRIMMING

The process of the invention for forming integrated circuits using low temperature ion implantation provides a method whereby high value resistors on the order of 50,000 ohms can be formed. Such resistors can be formed on the surface or buried beneath the surface. Referring to FIG. 1C, step 9, resistor 56 has been formed adjacent surface 11 of the wafer. However, it is understood that by ion implantation said resistor could be implanted at a depth beneath the surface as is, for example, underpass connector 58.

The temperature coefficient of resistance is related to concentration of the impurity. By utilizing the ion implantation method of the invention, high temperatures are avoided which would rediffuse the impurity resulting in a change in the temperature coefficient of resistance. Because the temperature coefficient of resistance may be maintained constant, it is possible to trim or alter the resistance value. The method of the invention for forming a resistor and trimming its value to a precise predetermined resistance is as follows:

First, diffusing or ion implanting two low resistant contacts 44 and 46 into the substrate 10.

Second, implanting ions of the selected impurity to form either a buried resistor or a surface resistor 56. While monitoring the resistance value, trim the said value by implanting ions of a different impurity types so as to alter the impurity concentration or the cross sectional areas of the resistance region 56.

Alternatively, the resistance value between contacts 44 and 46 is monitored during the original implantation of resistor 56, implantation being halted upon achieving the desired resistance value.

Because of the high temperature involved in thermal diffusion techniques it is impossible to monitor the resistance during formation of the resistor. In ion implantation, the temperature is constant and held at a relatively low value; therefore, the resistance can be monitored during formation or trimming of the resistor.

FORMATION OF SUB-COLLECTOR REGIONS

Referring to FIGS. 1D through 1G, a series of impurity profiles are shown demonstrating the various steps of the formation of P-N-P transistor 38/28/14 having a sub-collector junction 19.

The sub-collector junction of a transistor in either discrete or integrated form made by diffusion processes generally requires the use of an epitaxial growth step. For instance, in copending docket 14,481 of common assignee a sub-collector region in a transistor is formed by diffusing into a monocrystalline silicon wafer of P-type conductive an N+ region. Then, an N type collector region is epitaxially grown on the surface of the wafer, and then the base and emitter region are thermally diffused into the epitaxial layer. Because of the high temperature epitaxial growth step, the original sub-collector region becomes larger in all dimensions by further diffusion. As a result, a subsequent isolation diffusion step is required to isolate adjacent components.

The method of the invention for forming a sub-collector region eliminates this high temperature epitaxial growth step. For instance, a silicon substrate having a P- type conductivity with an impurity concentration of about $10^{15}$ or less atoms/cm$^3$ is implanted with a N type impurity such as arsenic at, for example, an ion beam energy of 10 kev to 1 mev to achieve an impurity concentration of about $10^{20}$ atoms/cm$^3$ at a distance below the surface of about 4.0 to 4.5 microns. Thus, referring to FIG. 1E, sub-collector region 152 is formed at a depth of 102 to 104 beneath the wafer surface, and an N type region 154 is provided between the sub-collector region and the wafer surface. Said region 154 will serve as an isolation region for subsequent implanted base and emitter regions. In another embodiment when the sub-collector need not be so deep (in order to guard against surface damage) the sub-collector region 152 could extend from 2.0 to 2.5 microns below the wafer surface. The width of the sub-collector region 152 should be made as narrow as possible; width of less than 1 micron being preferred.

A most important advantage of the process of the invention for forming the sub-collector region is that no epitaxial growth step is necessary. The P- region extends to the surface at a concentration, for example, of $10^{15}$ ions/cm$^3$ other than directly in the path of bombardment of regions 152 and 154, resulting in no need for isolation diffusion at a later stage to achieve high packing density integrated circuits having immediately adjacent devices.

Figure 1F:
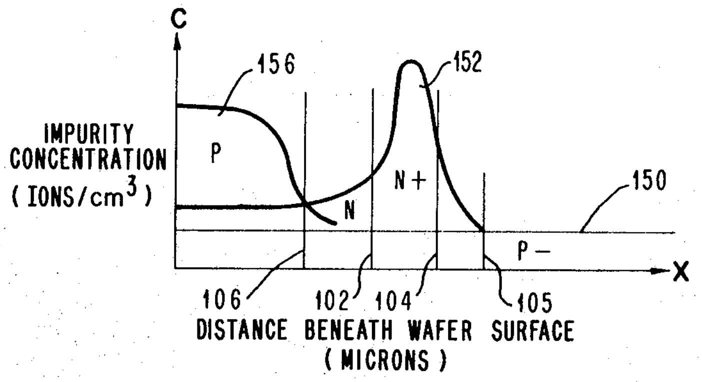
FIG. 1F is an impurity profile chart showing the impurity profile through section B″—B″ of FIG. 1B, step c.
Figure 1G:
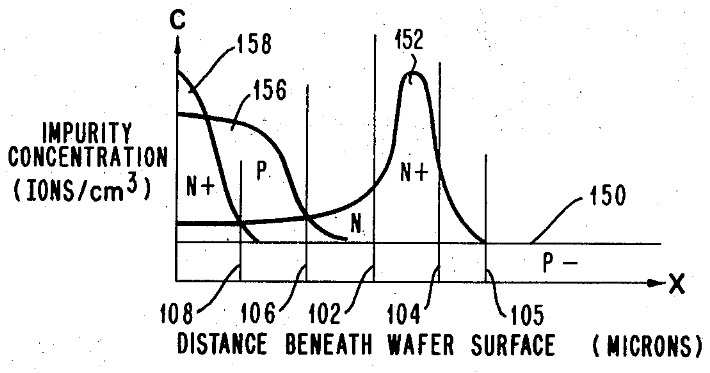
FIG. 1G is an impurity profile chart showing the impurity profile through section B‴—B‴ of FIG. 1B, step 4.

Referring to FIGS. 1F and 1G, subsequent ion bombardment of base region 156 with ions of a P type impurity and emitter region 158 with ions of an N type impurity complete the formation of the transistor structure. In each of these steps, stepping is necessary in order to achieve a constant impurity concentration, as has been previously described.

ALTERING IMPURITY PROFILES

Impurity profiles, junction locations, and impurity concentration are altered and changed by ion implanting impurities of the appropriate type into the regions to be changed. This may be necessary in order to achieve the electrical characteristics specified for the device being made. By this method, the base width may be altered, or a junction moved with respect to the surface.

(not shown) by appropriately controlling the ion beam energy.

The above process is merely an illustrative order of ion implantation steps. Because of the nature of ion implantation a region may be implanted at any depth in the wafer without affecting the region between the implanted region and the surface, and the above order of steps may be modified without departing from the scope of the invention. That is, the essence of the invention is a process where the various regions may be implanted without affecting the characteristics of previously implanted regions. Furthermore, the different devices may be implanted "immediately adjacent," there being no need for isolation of the devices by a region other than that of the original wafer 10; or similarly, for example, isolation of diode 26/14 from N-P-N transistor 38/24/14 is performed by previously implanted region 14b. Generally, when a first region is to be contained entirely within a second region, the said second region should first be implanted.

EXAMPLE 2: ION IMPLANTATION OF INTEGRATED CIRCUITS

Ion implantation, thermal diffusion, and epitaxial growth techniques may be combined to provide a high frequency transistor structure.

Although for the purpose of describing this invention reference is made to a semiconductor configuration wherein a P- type region is utilized as the substrate and subsequent semiconductor regions of the composite semiconductor structure are formed in the conductivity type described. It is readily apparent that the same regions that are referred to as being of one conductivity type can be of the opposite type conductivity and furthermore, some of the operations which are described as diffusion operations can be made by epitaxial growth or ion implantation and some of the epitaxial growth regions can be formed by diffusion techniques.

Referring now to FIGS. 2A, 2B, and 2C, a wafer of P- type conductivity having, for example, a resistivity of 10 to 20 ohms—centimeter is used as the starting material. Said wafer 200 may be formed as described previously.

An initial oxide layer or coating 202 preferably of silicon dioxide and having a thickness of 5200 angstrom units is thermally grown by conventional heating in a dry $0_2$ atmosphere for 10 minutes followed by heating in a wet or steam atmosphere at 1050° C. for 60 minutes. If desired, the oxide layer can be formed by pyrolythic deposition or by an RF sputtering technique, as described in patent application, Ser. No. 428,733, filed Jan. 28, 1965 and assigned to the same assignee as this invention.

By standard photolithographic masking and etching techniques a photoresist layer is deposited onto the wafer including the surface of the initial oxide layer formed thereon and by using the photoresist layer as mask surface regions are exposed on the surface of the wafer by etching away the desired portions of the silicon dioxide layer with a buffered HF solution. The photoresist layer is then removed to permit further processing.

A diffusion operation is carried out to diffuse into the exposed surface portions of the wafer N impurities to form N+ regions 204, 206 in the wafer having a $C_0$ of $2 \times 10^{20}/cm^3$ of N type majority carriers. The initial oxide layer serves as a mask to prevent the N+ region from being formed across the entire surface of the wafer. Preferably the diffusion operation is carried out in an evacuated quartz capsule using high arsenic doped silicon powder. As an alternative variation, the N+ regions can be formed by etching out a channel of the P-type wafer and then subsequently epitaxially growing N+ regions.

An oxidation cycle of 10 minutes in dry oxygen and 30 minutes in steam at 1150° C. carried out. The resulting oxide thickness is 600 angstrom units on the N+ regions and only 3000 angstrom units on the remainder of the wafer surface. Hence, the removal of the oxide layer with a buffered HF solution leaves a depression in the N+ semiconductor surface region.

After removing the oxided layer, a region 208 of N type conductivity, preferably having a resistivity of about 0.2 ohms per centimeter, is epitaxially grown on the surface of the wafer. The N type epitaxial region 208 is an arsenic doped layer approximately 5.5 to 6.5 microns thick. In action device fabrication, the arsenic impurities in the N+ region 204, 206, which are now buried outdiffuse about 1 micron during the epitaxial deposition.

Very shallow regions 210, 212 are next diffused or ion implanted with P type impurities such as boron or gallium. A thickness of 0.5 to 1.0 micron and having a surface impurity concentration of $10^{19}$ atoms/$cm^3$ is desired.

Impurity regions 220 and 222 are ion implanted and stepping performed to obtain a constant impurity concentration of approximately $5 \times 10^{19}$ atoms/$cm^3$ of the same impurity type as that which was implanted in regions 210 and 212. The P type impurity in region 220 and 222 may be of a different impurity but must be of the same type as in regions 210 and 212. Implanted region 214 is common to both regions 210 and 220, while implanted region 216 is common to both regions 212 and 222.

An impurity of a different type (i.e., an N type impurity which diffuses slower and requires a higher temperature to diffuse than the P type impurities previously implanted) is implanted into regions 220 and 222.

It is to be understood that the order of implanting the N and the P type impurities into regions 220 and 222 may be reversed, the essential element of the invention being at this point in the process that impurities of both type appear throughout the regions 220 and 222. The N type impurity in regions 220 and 222 may be, for example, antimony having a surface impurity concentration of $10^{21}$ atoms/$cm^3$.

It is essential in the formation of the N-P-N transistor of this embodiment that the N type impurity be a slower diffuser than the P type impurity.

The device is heated to a temperature in excess of 900° C. for a period of from 20 to 30 minutes. During this heat treatment, the P type impurity diffuses uniformly away from the N type emitter areas 226, 232 forming the base regions 224 and 230.

The resulting extremely fast, high frequency transistor structure has the following characteristics:

The emitter regions 226, 232 are highly doped essentially all the way to the emitter base junctions.

The emitter gradient at the junction is very steep, minimizing neutral capacitance.

Figure 5A:
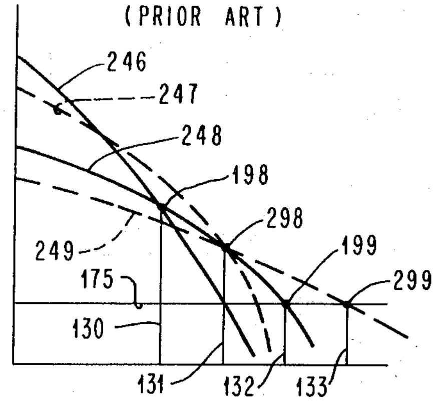
FIG. 5A is an impurity profile chart demonstrating the movement of the base-collector junction when thermal diffusion techniques of the prior art are utilized to move the base-emitter junction deeper.

The base 224, 230 doping is high due to the high concentration of the P doping and due to the fact that the Referring to FIG. 5A, an impurity profile chart is shown demonstrating the effect upon base width 130–132 when emitter junction 198 is moved to position 298 by heat treating a semiconductor transistor device. As the device is heated, the base impurity profile moves from position 248 to position 249 while the emitter region profile moves from region 246 to region 247. The original base width from 130 to 132 is changed to a width from 131 to 133.

Figure 5B:
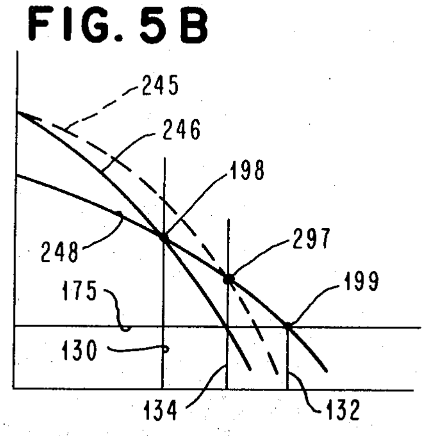
FIG. 5B is an impurity profile chart showing the movement of the base-emitter junction when ion implantation techniques are used to reduce the base width.

Referring to FIG. 5B, however, the ion implanting technique for controlling base width is clearly described. A transistor is shown having a base region profile 248 and an emitter region profile 246, with an emitter-base junction at 198 and a collector-base junction at 199. In order to narrow the base width of the device, ions of the impurity type forming the emitter region are implanted to move the emitter profile from 246 to 245, repositioning the emitter base junction at 297. However, as this step is a low temperature ion implanation, the collector base junction 199 remains stationary. Therefore, the base width is reduced from 132–130 to 132–134.

Thus, by the ion implantation technique of the invention, the emitter junction of devices in integrated circuits may be moved out away from the surface of the device without causing a corresponding movement in the collector base junction.

EXAMPLE 1; ION IMPLANTATION OF INTEGRATED CIRCUITS

The ion implantation method of the invention is a low temperature process for providing impurities in semiconductors. Even if the material must be annealed, temperatures of less than 500°C. for short periods are sufficient for ion implantation. Therefore, the invention makes it possible to fabricate a diode, transistor, capacitor, resistor or circuit completely with ion implantation, then return to an "immediately adjacent" area and perform similar operations to provide an entirely different component, or a component of different characteristics. Since it is a low temperature process, the second ion implantation fabrication will not affect the characteristics of the first device.

Referring now to FIG. 1A, 1B, and 1C, the process of the invention will be described for forming an integrated device. It is to be understood that the various devices are illustrative, and the invention does not reside in the resulting circuits, if any, but in the methods for making the devices within the substrate.

The first step of the process is to form a semiconductor wafer 10 to P- type conductivity and polish and orientate the surface 11.

Next, the N- sub-collector regions 17, 18, and 19 are formed by ion implantation of an N type impurity, such as aresenic, phosphorous or antimony. The beam energy should be sufficient to carry the impurity ions to the desired sub-collector region depth, and then the beam energy progressively reduced to form N type regions 12, 13 and 14 between the wafer surface 11 and sub-collector regions 17, 18, and 19. It is to be understood that the implantation of the various subcollector regions could be performed in one ion bombardment if the surface area is masked, as with photoresist. Otherwise, sub-collector 17 could first be implanted, then the ion beam refocused to implant sub-collector region 18, and so forth. It is to be noted that the implanted region 13/18 is "immediately adjacent" regions 12/17 and regions 14/19, and isolated from them by the P- region 10 of the original wafer. This isolated relationship will not be altered in subsequent steps because all the steps of this embodiment of the invention will be conducted at a temperature sufficiently low to prevent lateral diffusion of the impurities implanted in wafer 10.

(While the implantation of the gold impurity ions into the collector regions of the transistors and the N region of the diode is performed, in this embodiment, at a later stage in the process, it is understood that said gold implantation could occur, for instance, at this point in the process.)

Next, the diode P region 26 and the transistor base regions 22, 24, and 28 are implanted with a P type impurity. Said regions are implanted to a uniform concentration and a deep depth through stepping processes previously described. Region 26 is implanted "immediately adjacent" to region 28.

Next, the transistor emitter areas 32, 34, and 38 are implanted using an N type impurity, and stepping performed to obtain uniform impurity concentration throughout said regions. The emitter regions are also implanted deeply, to provide deep base-emitter junctions and narrow base widths for high speed, high breakdown voltage, rugged transistors.

Next, gold impurities are ion implanted into the collector region 12, 13 and 14 of the transistors and the N region 14 of the diode.

Next, a P type impurity is implanted within the wafer 10 interconnecting transistor base regions 22 and 24. The implantation of underpass connector 40 at a distance beneath the surface 11 of wafer 10 is performed so as not to alter the impurity concentration of collector regions 12 or 13 or of the wafer portion 10*b* between said collector regions. Similar underpass connections may be made wherever required in the substrate to build a particular integrated circuit.

At this point in the process there has been provided, without the need for isolation diffusion immediately adjacent devices of greatly differing electrical characteristics may be provided. The following steps illustrate the formation of an N-P-N transistor immediately adjacent to a P-N-P transistor, and the formation of resistors, underpass connectors, and capacitors.

To form a very steep base impurity profile for the P-N-P transistors, first an electrically neutral atoms, such as helium, is implanted into region 42 immediately adjacent region 14. Next, an implantation into the same region 42 of an electrically active N type impurity results in a very steep base impurity profile. Also, at this point in the process, N type regions 44, 46 and 48 and 49 are implanted to provide resistor contact areas and diode N regions.

Emitter region 52 is implanted with P type impurity to complete the pNP transistor 52/42/10.

The next step is formation of capacitor 54 by ion implantation of a P type impurity. The implantation energy, beam angle of incidence and time of implantation are controlled so that the portion of wafer 10 between said capacitor 54 and the surface 11 of the wafer and the previously implanted regions 44, 46, 48, and 49 are not significantly altered.

Finally, resistor 56 is formed by ion implantation of an N type impurity, and diode N region connector 58 is similarly formed. Resistor 56 is formed at the surface 11 or may be formed at a distance below surface 11 thermal diffusion starts essentially from the emitter-base junction, and not the surface.

The base 224, 230 width is uniform and doping in all directions from the emitter is also uniform.

The collector 208 essentially surrounds the base regions 224 and 230.

Referring again to FIG. 2C, the high speed transistors of the invention may be isolated by ion implanting a P type region 242 through a photoresist mask 240. The isolation region 242 is formed by stepping through various ion implanting energies. The transistors may be positioned very close together as it is unnecessary to allow for lateral diffusion of isolation region 242.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. A monolithic integrated semiconductor structure, comprising in combination, a plurality of functionally isolated individual transistors having gold impurities ion implanted in the collector regions.

2. A semiconductor transistor structure comprising emitter, base and collector regions in a semiconductor body, and lifetime killer impurities present substantially exclusively near the collector-base junction in said semiconductor body.

3. The semiconductor structure of claim 2 wherein the said lifetime killer impurities are in an area within 1 micron from the collector-base junction.

4. The semiconductor structure of claim 2 wherein the lifetime killer impurities are gold.

5. The semiconductor structure of claim 3 wherein the semiconductor structure forms a part of a monolithic semiconductor structure.

6. The semiconductor structure of claim 3 wherein the said impurities are within the collector region of said semiconductor body.

* * * * *

PO-1050
(5/69)

UNITED STATES PATENT OFFICE
CERTIFICATE OF CORRECTION

Patent No. 3,770,516 Dated November 6, 1973

Inventor(s) Michael C. Duffy et al

It is certified that error appears in the above-identified patent and that said Letters Patent are hereby corrected as shown below:

Column 13, Line 51 (In the Application, Page 29, Line 1) change "lillers" to -- killers --

Column 18, Line 56 (In the Application, Page 40, Line 3) change "pNP" to -- PNP --

Column 19, Line 17 (In the Application, Page 40, Line 30) change "38/24/14" to -- 38/28/14 --

Signed and sealed this 3rd day of December 1974.

(SEAL)
Attest:

McCOY M. GIBSON JR.
Attesting Officer

C. MARSHALL DANN
Commissioner of Patents